United States Patent [19]

Elmer

[11] Patent Number: 5,374,858
[45] Date of Patent: Dec. 20, 1994

[54] BUS DRIVER CIRCUIT

[75] Inventor: Werner Elmer, Moosburg, Germany

[73] Assignee: Texas Instruments Deutschland GmbH, Germany

[21] Appl. No.: 134,513

[22] Filed: Oct. 8, 1993

Related U.S. Application Data

[63] Continuation of Ser. No. 959,884, Oct. 13, 1992, abandoned.

[30] Foreign Application Priority Data

Oct. 10, 1991 [DE] Germany ............... 41337646

[51] Int. Cl.[5] .................................. H03K 17/60
[52] U.S. Cl. ............................ 327/333; 327/513; 326/90
[58] Field of Search ............ 307/270, 255, 254, 296.6, 307/310, 313, 317.2, 491, 443, 315, 300

[56] References Cited

U.S. PATENT DOCUMENTS

| | | | |
|---|---|---|---|
| 3,676,713 | 7/1972 | Wiedmann | 307/300 |
| 3,987,310 | 10/1976 | Peltier et al. | 307/313 |
| 4,085,359 | 4/1978 | Ahmed | 323/22 |
| 4,246,510 | 1/1981 | Baker | 307/300 |
| 4,415,817 | 11/1983 | Fletcher | 307/300 |
| 4,593,206 | 6/1986 | Neidorff et al. | 307/270 |
| 4,593,206 | 6/1986 | Neidorff et al. | 307/270 |
| 4,675,548 | 6/1987 | Eshbaugh | 307/300 |
| 4,705,968 | 11/1987 | Taki | 307/300 |
| 4,754,158 | 6/1988 | Halberstein | 307/315 |
| 4,777,386 | 10/1988 | Majumdar | 307/300 |
| 4,794,281 | 12/1988 | Onodera et al. | 307/592 |
| 4,851,715 | 7/1989 | Strong | 307/270 |
| 4,868,424 | 9/1989 | Bosnyak et al. | 307/443 |
| 4,897,566 | 1/1990 | Kitora et al. | 307/443 |
| 4,970,620 | 11/1990 | Lehnhoff et al. | 307/300 |
| 5,013,999 | 7/1991 | Yamada | 307/317.2 |
| 5,126,593 | 6/1992 | Mahler | 307/443 |
| 5,132,564 | 6/1992 | Fletcher et al. | 307/443 |
| 5,247,207 | 9/1993 | Wert et al. | 307/270 |

FOREIGN PATENT DOCUMENTS

| | | | |
|---|---|---|---|
| 3003849 | 8/1981 | Germany | 307/270 |
| 0004806 | 2/1972 | Japan | 307/270 |
| 0126324 | 7/1984 | Japan | 307/270 |
| 0126325 | 7/1984 | Japan | 307/270 |
| 0160725 | 8/1985 | Japan | 307/270 |
| 2238437 | 5/1991 | United Kingdom | 307/270 |

OTHER PUBLICATIONS

IBM Technical Disclosure Bulletin, vol. 21, No. 10 Mar. 1979.
IBM Technical Disclosure Bulletin, vol. 26, No. 7B, Dec. 1983.
IBM Technical Disclosure Bulletin, vol. 26, No. 5, Oct. 1985.
IBM Technical Disclosure Bulletin, vol. 26, No. 7B, Dec. 1983.
IBM Technical Disclosure Bulletin, vol. 31 No. 5 Oct. 1988.

Primary Examiner—Timothy P. Callahan
Assistant Examiner—T. T. Lam
Attorney, Agent, or Firm—Willilam E. Hiller; Richard L. Donaldson

[57] ABSTRACT

A bus driver circuit for applying a binary signal to a bus line comprises an input transistor ($Q_1$) for receiving the signal to be applied to the bus line and an output transistor ($Q_2$) which taps the signal from the emitter of the input transistor and furnishes its output signal at its collector via a Schottky diode ($D_1$). Between the base and the collector of the output transistor ($Q_2$) the collector-emitter path of a transistor ($Q_3$) is inserted, to the base of which a reference voltage ($U_{ref}$) for defining the low value (L) of the binary signal to be applied to the bus line is applied via a Schottky diode ($D_3$).

2 Claims, 1 Drawing Sheet

BUS DRIVER CIRCUIT

This application is a Continuation of application Ser. No. 07/959,884, filed Oct. 13, 1992 now abandoned.

The present invention relates to a bus driver circuit for applying a binary signal to a bus line comprising an input transistor for receiving the signal to be applied to the bus line and an output transistor which taps the signal from the emitter of the input transistor and emits its output signal to its collector via a Schottky diode.

The driver circuit is to be used in particular for a bus system which is suitable for personal computers and workstations having a high clock frequency (50 MHz and more) and permits a high data throughput. This bus system operates with logic levels different to the hitherto usual TTL or CMOS levels. It is referred to in technical literature as BTL bus system (BTL=Backplan Tranceiver Logic).

In contrast to TTL or MOS logic, in the BTL bus system the logic levels for "L" and "H" lie very close together. The L level is at 1 V and the H level at 2 V; the switching threshold is fixed at 1.5 V.

The output transistors used in bus driver circuits exhibit the known temperature dependence of their base-emitter voltage of 2 mV/° C. and consequently with a possible operating temperature range of 70° it is difficult to maintain the conditions required in a BTL bus system. Conventional BTL bus driver circuits, for example the interface circuit 75 ALS 056 of the company Texas Instruments, which is described in the 1988 handbook "Bus Interface Circuits" of said company, exhibit this undesirable temperature dependence. This voltage drift considerably restricts the signal-to-noise ratio at the bus and this of course impairs the operating reliability of the bus system.

The invention is therefore based on the problem of further developing a bus driver circuit of the type mentioned at the beginning so that in a BTL bus system a greater signal-to-noise ratio and thus increased operating reliability is achieved.

According to the invention, this problem is solved in that between the base and the collector of the output transistor the collector-emitter path of a transistor is inserted, to the base of which via a Schottky diode a reference voltage is applied for defining the low value of the binary signal to be applied to the bus line.

An example of embodiment of the invention will be described hereinafter with the aid of an the drawings, wherein.

Figure 1:
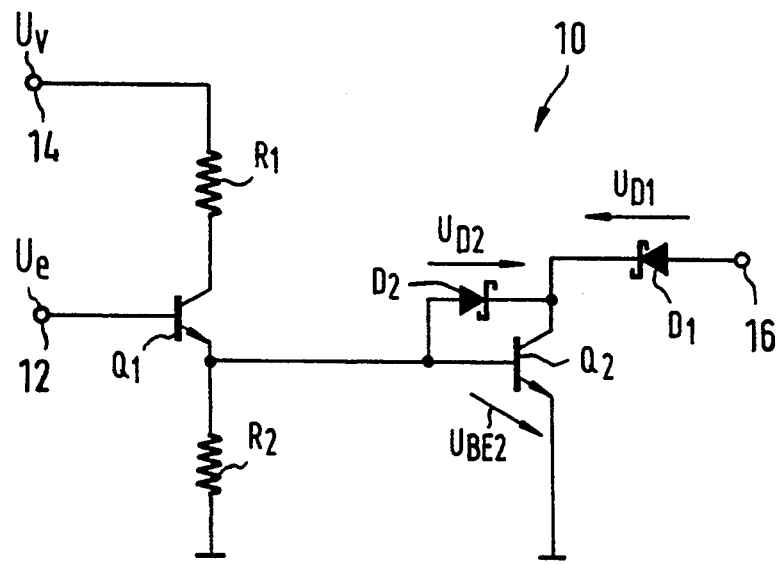
FIG. 1 shows a conventional bus driver circuit.

The conventional driver circuit 10 illustrated in FIG. 1 comprises substantially an input stage having an input 12 for receiving an input signal and a terminal 14 for applying a supply voltage $U_v$ and an output stage having an output 16 for emitting an output signal with the voltage value $U_a$. The input stage comprises an input transistor $Q_1$, the collector of which is connected via a resistor $R_1$ to the supply voltage terminal 14 and the emitter of which is connected via resistor $R_2$ to ground.

The output stage comprises an output transistor $Q_2$, the base of which is connected to the emitter of the transistor $Q_1$, which is thus operated as an emitter follower. The emitter of the transistor $Q_2$ is connected to ground and the collector is connected to the cathode of a Schottky diode $D_1$, at the anode of which the output signal is emitted.

Between the collector and the base of the transistor $Q_2$ there is another Schottky diode $D_2$ which prevents the transistor $Q_2$ from going into the saturation state. The purpose of the diode $D_1$ is to reduce the output voltage at the output 16.

The output voltage when the transistor $Q_2$ is conducting, which represents the L level, is calculated according to the following formula:

$$U_a = U_{D1} - U_{D2} + U_{BE2}$$

Herein, $U_{D1}$ and $U_{D2}$ are the voltages at the diodes $D_1$ and $D_2$, while $U_{BE2}$ is the base-emitter voltage of the transistor $Q_2$. The temperature drift of the Schottky diodes $D_1$ and $D_2$ is identical. If the Schottky diodes $D_1$ and $D_2$ are operated with the same current density the formula is simplified and:

$$U_a = U_{BE2}$$

Consequently, the output voltage $U_a$ drifts exactly in the same manner as the base-emitter voltage $U_{BE2}$ of the transistor $Q_2$ with 2 mV/° C. In a temperature range of 0° to 70° C. this results in a voltage drift of more than 140 mV.

Figure 2:
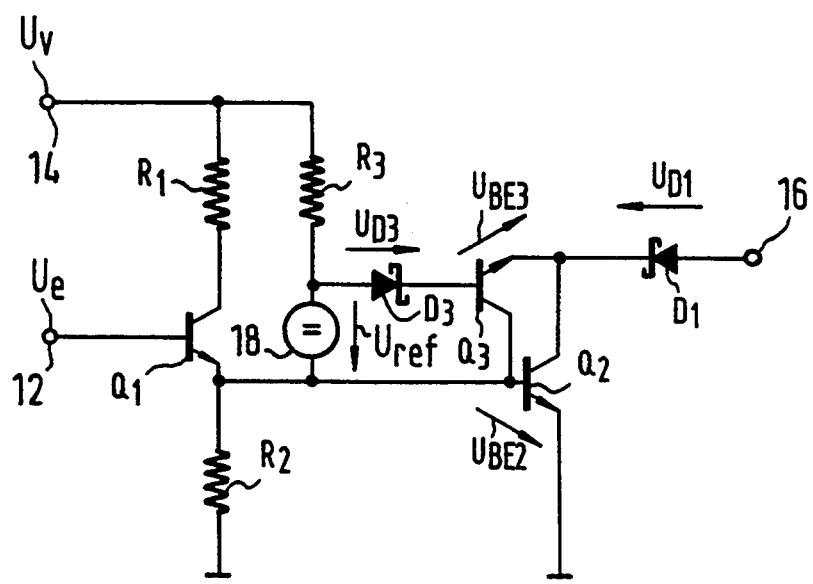
FIG. 2 shows a bus driver circuit configured according to the invention.

This disadvantage is eliminated by the driver circuit illustrated in FIG. 2.

As apparent from FIG. 2, the input stage of the driver circuit is identical to the input stage of the driver circuit illustrated in FIG. 1. However, the output stage is modified so that a compensation of the temperature-dependent voltage drift is obtained, as will be apparent from the following explanations.

The temperature-compensated output stage contains in addition to the output transistor $Q_2$ a transistor $Q_3$, the collector of which is connected to the base of the transistor $Q_2$ and the emitter of which is connected to the collector of the transistor $Q_2$; the base thereof is connected via a Schottky diode $D_3$ to a terminal of a reference voltage source 18, the other terminal of which is connected to the base of the transistor $Q_2$ and which furnishes a reference voltage $U_{ref}$. It is possible to use for example as reference voltage source 18 a highly accurate band gap reference circuit as is described in "BIPOLAR AND MOS ANALOG INTEGRATED CIRCUIT DESIGN" by Alan. B. Grebene, 1984, p. 206. This band gap reference circuit is present in a BTL chip for defining the threshold value of the receiver circuit. The reference voltage can easily be generated from this band gap reference circuit. As in FIG. 1, the output 16 of the output stage is formed by the anode of the Schottky diode $D_1$, the cathode of which is connected to the collector of the output transistor $Q_2$.

The driver circuit of FIG. 2 operates similarly to the conventional driver circuit illustrated in FIG. 1. An input voltage with H level sets the output transistor $Q_2$ into the conductive state. As a result, the output voltage $U_a$ assumes the low L level.

As can be readily seen from FIG. 2, the output voltage $U_a$ is calculated by the following formula:

$$U_a = U_{D1} - U_{BE3} - U_{D3} + U_{ref} + U_{BE2} \qquad (1)$$

The temperature drift of the two Schottky diodes $D_1$ and $D_3$ and of the transistors $Q_2$ and $Q_3$ is identical. If the Schottky diodes $D_1$ and $D_3$ and the transistors $Q_2$ and $Q_3$ are operated with the same current density, as is the case with a properly dimensioned circuit, equation (1) simplifies to:

$$U_a = U_{ref} \qquad (2)$$

This means that the output voltage $U_a$ is independent of the temperature. In addition, the output voltage has the value of the extremely accurate reference voltage $U_{ref}$ and consequently the L level is fixed exactly and very constant.

I claim:

1. A bus driver circuit for applying a binary signal to a bus line comprising:

an input transistor having base, collector and emitter electrodes for receiving the binary signal to be applied to the bus line at the base of said input transistor, the collector of said input transistor being connected to a terminal for providing a supply voltage;

an output transistor having base, collector and emitter electrodes, the base of said output transistor being connected to the emitter of said input transistor;

an output terminal connected to the collector of said output transistor;

a Schottky diode interposed between the collector of said output transistor and said output terminal and respectively connected thereto;

an inserted transistor having base, collector and emitter electrodes, the collector of said inserted transistor being connected to the base of said output transistor, the emitter of said inserted transistor being connected to the collector of said output transistor, said inserted transistor thereby having a collector-emitter path disposed between the base and the collector of said output transistor;

a reference voltage source having a first terminal connected to the base of said inserted transistor and a second terminal connected to the base of said output transistor; and a second Schottky diode interposed between the first terminal of said reference voltage source and the base of said inserted transistor and being respectively connected thereto;

said inserted transistor, said second Schottky diode and said reference voltage source cooperating to define the low value of the binary signal to be applied to the bus line via said output terminal.

2. A bus driver circuit as set forth in claim 1, wherein said second Schottky diode is connected with its cathode to the base of said inserted transistor;

the collector of said output transistor being connected to the cathode of the first-mentioned Schottky diode; and said reference voltage source being a band gap voltage source.

* * * * *